(12) United States Patent
Beatty et al.

(10) Patent No.: US 7,200,060 B2
(45) Date of Patent: Apr. 3, 2007

(54) MEMORY DRIVER ARCHITECTURE AND ASSOCIATED METHODS

(75) Inventors: Timothy S. Beatty, Mesa, AZ (US); Franco Ricci, Chandler, AZ (US); Lawrence T. Clark, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/620,469

(22) Filed: Jul. 15, 2003

(65) Prior Publication Data

US 2005/0013190 A1 Jan. 20, 2005

(51) Int. Cl.
G11C 7/00 (2006.01)

(52) U.S. Cl. ............. 365/203; 365/189.05; 365/189.08

(58) Field of Classification Search ................ 365/203, 365/189.05, 189.08, 189.02, 189.07, 230.02, 365/63, 230.03; 711/211
See application file for complete search history.

(56) References Cited

U.S. PATENT DOCUMENTS

| 5,564,052 | A | * | 10/1996 | Nguyen et al. | ................ 712/42 |
| 5,805,517 | A | * | 9/1998 | Pon | ............................ 365/212 |
| 6,175,532 | B1 | * | 1/2001 | Ooishi | .................... 365/230.03 |
| 6,201,753 | B1 | * | 3/2001 | Akaogi et al. | .............. 365/226 |
| 6,317,351 | B2 | * | 11/2001 | Choi et al. | ..................... 365/49 |
| 2004/0111746 | A1 | * | 6/2004 | Hoang | ......................... 725/54 |

* cited by examiner

*Primary Examiner*—Anh Phung
*Assistant Examiner*—Dang Nguyen
(74) *Attorney, Agent, or Firm*—Michael A. Proksch

(57) ABSTRACT

A memory driver architecture and associated methods are generally described.

12 Claims, 3 Drawing Sheets

MEMORY DRIVER ARCHITECTURE AND ASSOCIATED METHODS

TECHNICAL FIELD

Embodiments of the present invention are generally directed to computing systems and, more particularly, to a memory driver architecture and associated methods, e.g., for use in association with a content addressable memory (CAM).

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Those skilled in the art will appreciate that the virtual addressing schemes employed by certain operating systems require that a subset of bits in an address be replaced with a process identifier (PID) when the subset of bits in the address are composed of zeroes. Thus, embodiments of the invention are generally directed to a memory driver architecture and associated methods for use, e.g., with a content addressable memory (CAM), although the invention is not limited to such an implementation. More particularly, an innovative high-speed memory driver with integrated multiplexing and process identification (PID) insertion, and methods associated therewith, are introduced herein.

According to one example implementation, an integrated content addressable memory (CAM) driver is presented comprising, in part, selection logic coupled with a multiplexing element. In accordance with such an implementation, the selection logic provides an indication of whether to promote the received address, or a modified version thereof, based, at least in part, on the content of at least a subset of the received address. In response to an indication received is from the selection logic, the multiplexing element selectively promotes at least one of the received address, or a modified version thereof to a coupled pulsed latch element, for selective assertion to a memory cell.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Example Driver Architecture

Figure 1:
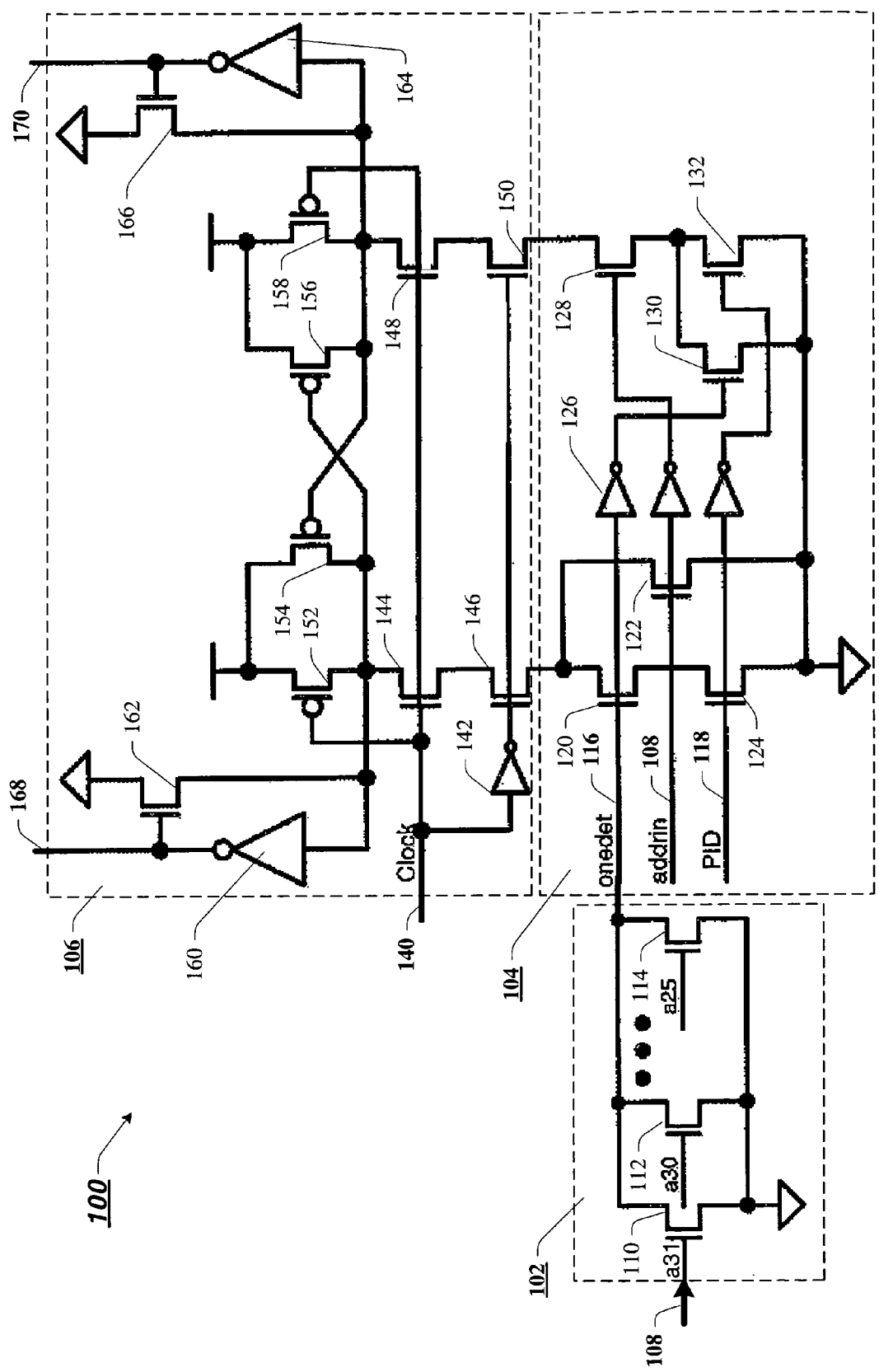
FIG. 1 is a block diagram with select schematic detail of an example memory driver architecture, in accordance with one example embodiment of the invention.

FIG. 1 illustrates a block diagram of at least a subset of an example memory driver architecture 100, according to one embodiment of the invention. In accordance with the illustrated example embodiment of FIG. 1, driver architecture 100 is depicted comprising one or more of a selection logic element 102, a multiplexing element 104 and a pulsed latch element 106, each coupled as depicted. Although depicted as a number of individual elements (i.e., denoted by dashed boxes), the selection logic 102, multiplexing element 104 and pulsed latch element 106 are integrated within a single driver architecture, e.g., implemented within a processor (not particularly denoted), to provide improved performance characteristics in support of the virtual addressing schemes introduced above.

For purposes of explanation, an example circuit implementation of the functional elements 102–106 of the memory driver 100 is presented, although the invention is not limited in this respect. For example, selection logic 102 is depicted comprising a number of n-type metal oxide semiconductor (NMOS) transistors 110, 112, 114 coupled as shown to receive one or more bits of an address from a remote element (not particularly denoted).

In accordance with the illustrated example of FIG. 1, the NMOS transistors 110, 112 and 114 of selection logic 102 receive bit(s) of an address 108 at their gate, although the invention is not limited in this respect. The source of the NMOS transistors 110–114 is coupled to a voltage potential, e.g., a ground voltage potential. The drain of the NMOS transistors 110–114 is coupled together to provide an indication (labeled, e.g., onedet) to the multiplexing element 104 of whether the received address bit(s) are composed of zeroes. If a value of one (1) is identified at one of the input bit(s) to transistor(s) 110–114, selection logic 102 provides an indication thereof to multiplexing element 104. In this regard, selection logic 102 may well be described as a one-detect circuit, although the invention is not limited in this regard. Alternatively, a zero detect circuit may well be used.

Multiplexing element 104 is depicted comprising a number of NMOS transistors 120, 122, 124, 128, 130 and 132, and inverter elements 126A . . . N, each coupled as shown to receive the one-detect indication 116, the received address 108 or the process identifier (PID) 118, or complements thereof, as shown. More particularly, the gate of NMOS transistors 120, 122 and 124 are coupled to receive one of the one-detect input 116, received address 108, and the process identifier (PID) 118, as shown. Transistors 120 and 124 are coupled in a stacked configuration, wherein the source of transistor 120 is coupled to the drain of transistor 124, while the source of transistor 124 is couple to a voltage potential, e.g., a ground potential. The drain of transistor 122 is coupled to the drain of transistor 120. The source of transistor 122 is coupled to the source of transistor 124. As shown, the value of the one-detect input controls transistor 120, which controls whether bit(s) from the received address 108 (i.e., at transistor 122) or the PID 118 (i.e., at transistor 124 are promoted to the pulsed latch element 106.

Similarly, the gates of transistors 128, 130 and 132 are each coupled to receive a complement of one of the one-detect indication 116, received address 108, or PID 118, as passed through one or more inverter elements 126A . . . N.

According to the illustrated example implementation, the cascode configuration of multiplexing element serves to isolate the source(s) of the input(s) (not particularly denoted) from feedback from the driver architecture 100.

As shown, transistors 128 and 132 are coupled in a stacked configuration, with the source of transistor 128 coupled to the drain of transistor 132. The source of transistor 132 is coupled to the source of transistors 122 and 124, which are coupled to a voltage potential, e.g., a ground potential. The drain of transistor 130 is coupled between the source and drain of transistors 128 and 132, respectively, while the source of transistor 130 is coupled to the source of transistor 132, e.g., a ground voltage potential, as shown.

Those skilled in the art will appreciate from the foregoing architectural description that multiplexing element 104 may promote either an element of the received address or an element of a process identifier (PID), and the complement thereof (i.e., the address or the PID), to the pulsed latch 106 based, at least in part, on the content of the received address, i.e., whether selection logic 102 detects a one (1) in the subset of the received address. If so, the element of the received address and its complement are promoted from the differential multiplexing element 104 to the pulsed latch element 106, for selective assertion to a coupled memory element.

In accordance with the illustrated example embodiment of FIG. 1, pulsed latch element 106 is depicted comprising a number of n-type MOS transistors 144–148, 162 and 166, a number of p-type MOS (PMOS) transistors 152–158, and inverter elements 142, 160 and 164, each coupled as depicted. It will be appreciated that although a particular schematic configuration is presented, alternate configurations that nonetheless perform the functions described herein are anticipated within the scope and spirit of the present invention.

According to one embodiment pulsed latch element 106 is depicted comprising a pulse generator comprised of a differential pair of stacked NMOS transistors 144–150, and inverter element 142, each coupled to an input clock signal 140, or its complement, as shown, although the invention is not limited in this regard. In the first transistor stack, transistor 144 is coupled to receive the clock signal 140 at its gate, while its source is coupled to the drain of transistor 146. The gate of transistor 146 is coupled to receive a complement of the clock signal 140 from inverter element 142. The source of transistor 146 is coupled to receive one of the differential outputs from multiplexing element 104, as shown.

In the second differential stacked transistor pair, transistor 148 is coupled to receive the clock signal 140 at its gate, while its source is coupled to the drain of transistor 150. The gate of transistor 150 is coupled to receive a complement of the clock signal 140 from inverter element 142. The source of transistor 150 is coupled to receive one of the differential outputs from multiplexing element 104, as shown. The drain of transistor 144 and 148 provides the logic inputs to a latching mechanism of latch element 106 for selective assertion to, e.g., a coupled memory cell.

It will be appreciated given the schematic diagram, that the pulse generator passes a clock signal 140 to the gates of transistors 144 and 148, while passing an inverted clock signal, slightly delayed in time (e.g., through inverter element 142) to the gate of transistors 146 and 150. This time differential in between the clock signal and the inverted clock signal provides a pulse to the latch mechanism, described more fully below. An example of the signals provided by pulse generator are graphically illustrated with reference to FIG. 2.

Figure 2:
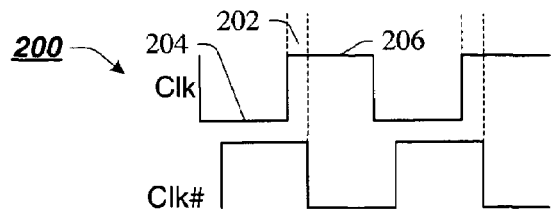
FIG. 2 is a timing diagram of a pulse generated from an example pulse generator element of the memory driver architecture, according to but one example embodiment of the invention.

In FIG. 2, a timing diagram of signals generated by the pulse generator of latch element 106 is presented, according to one example embodiment of the invention. In accordance with the timing diagram 200, a clock signal (clk) and an inverted clock signal (clk#) are depicted, the inverted clock signal (clk#) evidencing a time delay generated by passing the clock signal through an inverter element 142. This time delay creates a pulse 202, as the clock signal and its complement are out of phase.

As will be described more fully, below, the phase of the clock signal may define a phase of the latch element 106. For example, when the phase of the clock (clk) is low, reference 204, the latch element 106 is in a precharge phase, where the latch element 106 is isolated from the multiplexing element 104 by transistor(s) 144 and 148. As will be described more fully below, during precharge, the output of latch element 106 is set to logical zero.

On the rising edge of the clock, the latch element 106 transitions from a precharge phase to an evaluation (or, discharge) phase. On the rising edge of the clock, transistors 144 and 148 are enabled, while transistors 146 and 150, triggered by the delayed clock complement (clk#) remain enabled for one inverter delay. This delayed, complementary transition of the clock defines a pulse for the latch element 106. During this pulse 202, the latch element 106 chooses a state based on the input values provided at the differential output of multiplexing element 104. Latch element 106 will hold this value for at least the rest of the high phase 206 of the clock signal 140.

Returning to FIG. 1, the latching mechanism of latch element 106 is depicted comprising PMOS transistor pairs 154 and 156, and NMOS transistors 162 and 166, each coupled as shown. As used herein, PMOS transistors 152 and 158 form a precharge element for the latching mechanism 106. In this regard, the gate of PMOS transistors 152 and 158 is coupled with the clock input 140. The source of PMOS transistors 152 and 158 is coupled to receive one of the differential logic outputs of multiplexing element 104, i.e., via the drain of NMOS transistor 144 or 148, respectively. The drain of PMOS transistors 152 and 158 is coupled to receive a voltage potential, e.g., a high voltage potential.

PMOS transistors 154 and 156 are cross coupled such that the gate of transistor 156 is coupled with the drain of transistor 154 to receive a logic input from one of the differential outputs of the multiplexing element via the drain of NMOS transistor 144, as shown. Similarly, the gate of transistor 154 is coupled with the drain of transistor 156 to receive a logic input from one of the differential outputs of multiplexing element via the drain of NMOS transistor 148, as shown. The source of each of PMOS transistors 154, 156 is coupled to the drain of PMOS transistors 152 or 154, respectively, which is coupled to receive a high voltage potential.

The differential outputs of the latch element 106 are comprised of an inverter element 160, 164 coupled to a gate of NMOS transistors 162 or 166, respectively. The drain of transistors 162 and 164 are coupled with a differential output of multiplexing element 104 via the drain of transistors 144 or 148, respectively. The output of inverter elements 160 and 164, respectively, are coupled to provide the differential latch outputs 168 and 170, as controlled by the pulsed latch element 106, the operation of which will be described more fully below.

It should be appreciated that while a differential domino driver architecture 100 is illustrated in FIG. 1, the invention may also be implemented in a single ended domino architecture. That is, when the target of the driver architecture is implemented in a differential architecture (e.g., CAM, Translation Lookaside Buffer (TLB), etc.), as with the CAM above, the driver architecture 100 may also be implemented in a differential form, as particularly disclosed herein, although the invention is not limited in this respect.

Example Operation

Figure 3:
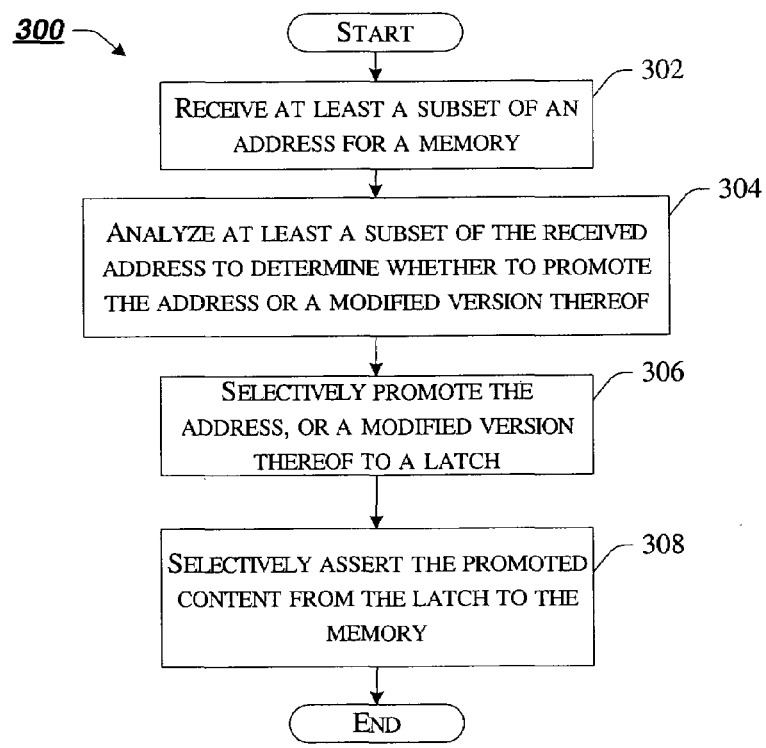
FIG. 3 is a block diagram of an example implementation of an example embodiment of the invention.

Having introduced an example embodiment of the innovative driver architecture, above, attention is now directed to FIG. 3, where an operational example implementation of the driver architecture 200 is presented, although the invention is not limited in this respect. For ease of illustration, and not limitation, the method of FIG. 3 is developed with continued reference to FIGS. 1 and 2, as appropriate. Nonetheless, it is to be appreciated that the teachings of FIG. 3 may well be implemented in alternate network architectures/configurations without deviating from the spirit and scope of the present invention.

FIG. 3 is a flow chart of an example method of operation of the innovative driver architecture introduced herein, according to one example embodiment of the invention. In accordance with the illustrated example embodiment of FIG. 3, the method begins in block 302, wherein memory driver 100 receives at least a subset of an address for, e.g., a content addressable memory (CAM). As introduced above, elements (e.g., bit(s)) of an address 108 are received at a gate of one or more NMOS transistor(s) 110–114.

In block 304, selection logic 102 analyzes the received subset of address 108 to determine whether an element (e.g., bit) of the subset of the received address should be modified to reflect a received process identifier (PID) 118. More particularly, as introduced above, selection logic 102 may employ a one-detect circuit, which provides an indication at the drain of the transistors 110–114 comprising the one-detect circuit whether at least one element of the subset of the received address includes a one (1).

In block 306, multiplexing element 104 selectively promotes the address, or a modified version thereof to latch element 106 based, at least in part, on the indication received from selection logic 102. As introduced above, elements (e.g., bit(s)) of at least a subset of an address 108, or the complement thereof, are received at the gate of transistors 122 and 128, respectively. Similarly, elements (e.g., bit(s)) of a process identifier (PID) 118, or the complement thereof, are received at transistors 124 and 132 respectively. The indication 116 from selection logic, and the complement thereof, received at the gate of transistors 120 and 130, selectively determine whether the received address element(s) 108, or the elements of the PID 118 are promoted to the latch element 106.

In block 308, latch element 106 selectively asserts the promoted content (e.g., the address, or the PID) from the latch to a coupled memory (not particularly denoted). More particularly, as introduced above, during a low phase 204 of the clock 140, the driver 100 is in a precharge phase. That is, the multiplexing element 104 is effectively isolated from the latching mechanism of latch element 106 by transistors 144 and 148. On the rising edge of the clock 140, the PMOS precharges 152–158 are shut off, and transistors 144 and 148 are enabled (closed). Transistors 146 and 150, coupled to a complement of the clock 140 through inverter 142 continue to be enabled for one inverter delay, before being disabled on the falling complement clock edge. This overlap in the enabled transistors effectively creates a pulse 202 for the latching mechanism of latch element 106. The pulse marks the beginning of an evaluation, or discharge, phase of the latch 106.

As introduced above, during the pulse 202, the latching mechanism chooses a state based on the indication 116 from the selection logic 102 and the input values 108, 118, as provided by the multiplexing element 104. In accordance with the illustrated differential embodiment, latch element 106 generates both the output value and its complement, although the invention is not limited in this respect. As discussed above, the latch 106 will hold the output value throughout the evaluation phase (e.g., during the high-phase 206 of clock 140), before returning to a precharge phase.

After the pulse duration 202 (or, inverter delay), the latching mechanism of latch element is once again isolated from the multiplexing element 104 by transistors 146 and 150 which are disabled by the low-phase of the complement of clock 140 (clk#). This allows the multiplexing element to continue with new inputs (116, 108, 118) in accordance with the process described above after the appropriate hold time (e.g., pulse width 202). By having transistors 146 and 150 clocked with the complement of clock 140 (clk#), changes at the input to latch 106 will not propagate charge-sharing transients to the output of latch 106.

Figure 4:
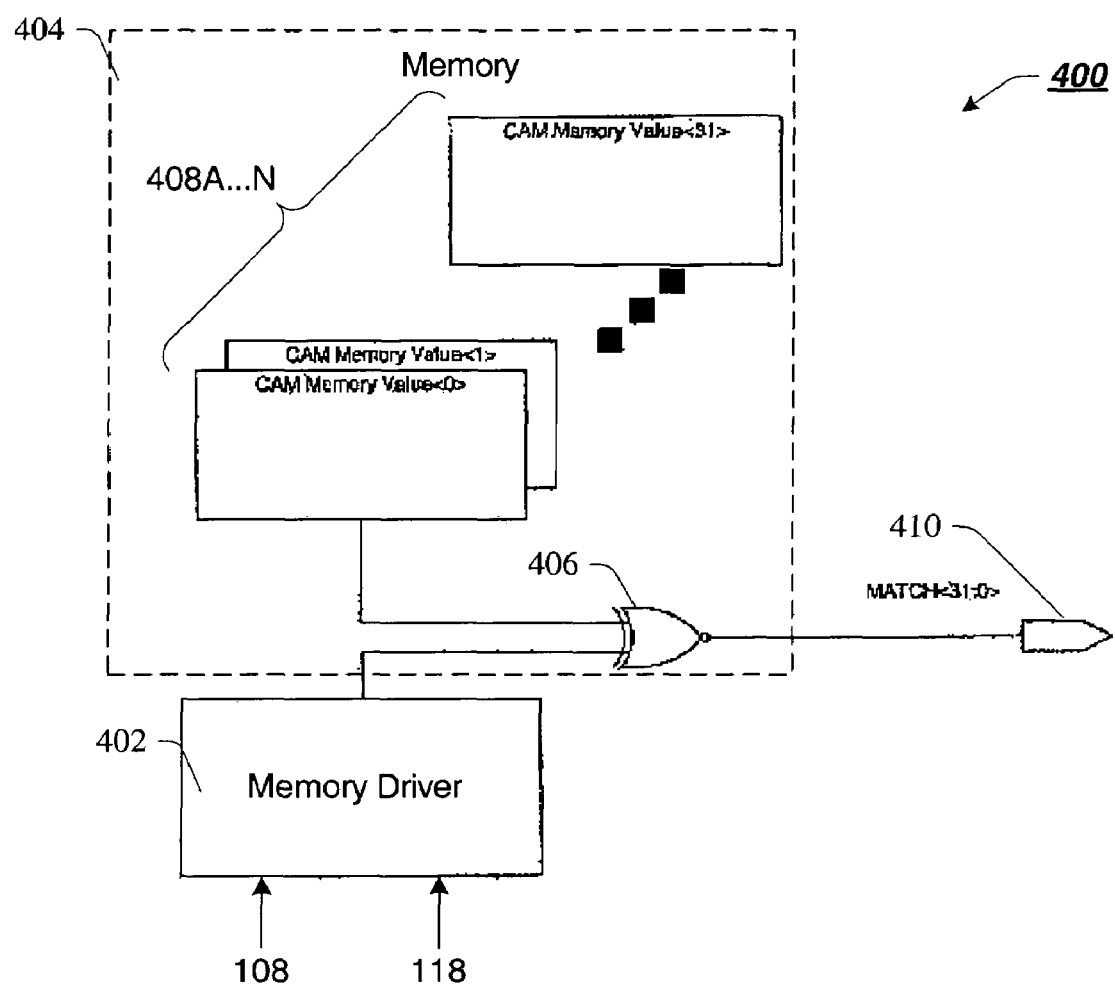
FIG. 4 is a flow chart of an example method of operating the example memory driver architecture with a content addressable memory (CAM), according to one embodiment of the invention.

Turning next to FIG. 4, a block diagram of an example implementation is presented, in accordance with one embodiment of the invention. In accordance with the illustrated example embodiment of FIG. 4, system 400 is depicted comprising a memory driver 402, incorporating the teachings of the present invention, and a memory 404, each coupled as shown. As used herein, memory 404 is intended to represent any of a wide variety of memory structures and/or devices including, but not limited to, a content addressable memory (CAM), a translation lookaside buffer, and the like, although the invention is not limited in this respect.

As introduced above, memory driver 108 receives one or more of at least a subset of an address 108 and/or a process identifier (PID) 118, and asserts the received address, or a modified version thereof inserting the PID 118 as some portion of the address to memory 404.

Memory 404 is depicted comprising one or more address memory value(s) 408A . . . N, which are compared to the content asserted from driver 402 at comparator 406. The output of comparator 406 provides an indication of whether the content asserted from memory driver 402 resulted in a "hit" within memory 404.

Alternate Embodiment(s)

Figure 5:
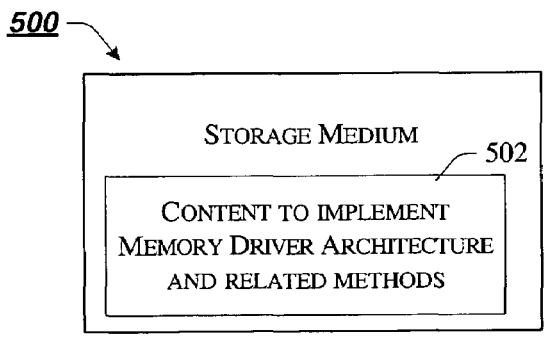
FIG. 5 is a block diagram of an example article of manufacture including content which, when executed by an accessing appliance, causes the appliance to implement one or more aspects of embodiment(s) of the invention.

FIG. 5 illustrates a block diagram of an example storage medium comprising a plurality of executable instructions which, when executed, may cause an accessing machine to implement one or more aspects of the innovative memory driver architecture 100 and/or associated methods 300. In this regard, storage medium 500 includes content 502 which, when executed, causes an accessing appliance to implement one or more aspects of memory driver 100, described above.

The machine-readable (storage) medium 500 may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Embodiments of the present invention may be used in a variety of applications. Although the present invention is not limited in this respect, the circuits disclosed herein may be used in microcontrollers, general-purpose microprocessors, Digital Signal Processors (DSPs), Reduced Instruction-Set Computing (RISC), Complex Instruction-Set Computing (CISC), among other electronic components. However, it should be understood that the scope of the present invention is not limited to these examples.

Embodiments of the present invention may also be included in integrated circuit blocks referred to as core memory, cache memory, or other types of memory that store electronic instructions to be executed by the microprocessor or store data that may be used in arithmetic operations. In general, an embodiment using multistage domino logic in accordance with the claimed subject matter may provide a benefit to microprocessors, and in particular, may be incorporated into an address decoder for a memory device. Note that the embodiments may be integrated into radio systems or hand-held portable devices, especially when devices depend on reduced power consumption. Thus, laptop computers, cellular radiotelephone communication systems, two-way radio communication systems, one-way pagers, two-way pagers, personal communication systems (PCS), personal digital assistants (PDA's), cameras and other products are intended to be included within the scope of the present invention.

The present invention includes various operations. The operations of the present invention may be performed by hardware components, such as those shown in FIGS. 1, 2 and/or 6, or may be embodied in machine-executable content (e.g., instructions) 702, which may be used to cause a general-purpose or special-purpose processor or logic circuits programmed with the instructions to perform the operations. Alternatively, the operations may be performed by a combination of hardware and software. Moreover, although the invention has been described in the context of a computing appliance, those skilled in the art will appreciate that such functionality may well be embodied in any of number of alternate embodiments such as, for example, integrated within a communication appliance (e.g., a cellular telephone).

Many of the methods are described in their most basic form but operations can be added to or deleted from any of the methods and information can be added or subtracted from any of the described messages without departing from the basic scope of the present invention. Any number of variations of the inventive concept are anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A memory driver comprising:
   selection logic, to receive an address for promotion to a memory, and to provide an indication of whether to promote the received address or a modified version thereof to the memory;
   a multiplexing element, responsive to the selection logic, to selectively promote either the received address or the modified version thereof to the memory based, at least in part, on the received indication;
   a pulse generator element, to receive a clock signal and produce at least two reference signals, overlapping yet offset from one another in time; and
   one or more driver elements, coupled to the multiplexing element and responsive to the pulse generator element, to receive content promoted from the multiplexing element during a precharge phase the reference signals, and to assert the content received from the multiplexer to the memory during a discharge phase of the reference signals.

2. A memory driver according to claim 1, further comprising:
   a latch element including the pulse generator and driver element(s), coupled to the multiplexing element, to assert address content received from the multiplexing element to the memory.

3. A memory driver according to claim 2, the pulse generator element comprising:
   two parallel processing paths, one of which including a delay element, wherein the parallel processing paths receive the clocking signal, or a delayed version thereof, at a gate of a transistor to control the precharge and discharge cycles of the coupled latch.

4. A memory driver according to claim 2, the driver element comprising:
   a differential domino transistor architecture, coupled to the multiplexer output and responsive to the pulse generator, to generate a differential memory output of an element of the promoted address content and its complement.

5. A memory driver according to claim 1, the selection logic comprising:
   detection logic, to determine whether at least a subset of the received address is composed of zeroes.

6. A memory driver according to claim 5, wherein the detection logic is a one-detect circuit.

7. A memory driver according to claim 1, the selection logic comprising:
   detection logic, to determine whether at least a subset of the received address is composed of a predefined value.

8. A memory driver according to claim 1, the nultiplexer element comprising:
   a first and second set of stacked transistors, wherein individual transistors of the first set are coupled to receive at their gate one of an indication from the selection logic, an address, and a process identification (PID) value, while individual transistors of the second set are coupled to receive at their gate a complement of the indication, the address and the PID value.

9. A memory driver according to claim 8, wherein depending on the indication received from the selection logic, the multiplexer element promotes either the received address and complement thereof, or the process identifier (PID) and complement thereof to the latch element.

10. A memory driver according to claim 2, the latch comprising:

a first and second differential set of transistors, coupled to the multiplexing element, to assert either the received address and complement thereof, or the PID and complement thereof to a memory device.

11. A memory driver according to claim 10, wherein the latch is coupled to the multiplexing element through a transistor responsive to a pulse generator, such that the latch is isolated from the multiplexing element during a precharge phase of the pulse generator, and asserts content at the output of the multiplexing element during a discharge phase of the pulse generator.

12. A storage medium comprising content which, when executed by an accessing machine, causes the machine to generate a memory driver according to claim 1.

* * * * *